(12) United States Patent
Lin et al.

(10) Patent No.: US 11,002,783 B2
(45) Date of Patent: May 11, 2021

(54) METHOD FOR INSPECTING LIGHT-EMITTING DIODES AND INSPECTION APPARATUS

(71) Applicant: Industrial Technology Research Institute, Hsinchu (TW)

(72) Inventors: Yan-Rung Lin, Hsinchu (TW); Chih-Hsiang Liu, Hsinchu County (TW); Shie-Chang Jeng, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 269 days.

(21) Appl. No.: 16/231,607

(22) Filed: Dec. 24, 2018

(65) Prior Publication Data

US 2020/0200817 A1 Jun. 25, 2020

(30) Foreign Application Priority Data

Dec. 21, 2018 (TW) ................................ 107146378

(51) Int. Cl.
*G01R 31/26* (2020.01)
*G01R 31/01* (2020.01)
*G01R 29/14* (2006.01)

(52) U.S. Cl.
CPC ......... *G01R 31/2635* (2013.01); *G01R 29/14* (2013.01); *G01R 31/01* (2013.01)

(58) Field of Classification Search
CPC ..... G01R 31/2635; G01R 29/14; G01R 31/01
See application file for complete search history.

(56) References Cited

U.S. PATENT DOCUMENTS

| 4,983,911 A | 1/1991 | Henley |
| 2009/0136120 A1 | 5/2009 | Onushkin et al. |
| 2010/0265707 A1 | 10/2010 | Van Herpen et al. |
| 2013/0027543 A1* | 1/2013 | Boeykens .......... G01R 31/2635 348/92 |
| 2013/0062633 A1* | 3/2013 | Demuynck ............ H05K 3/284 257/88 |

(Continued)

FOREIGN PATENT DOCUMENTS

| CN | 102175931 | 9/2011 |
| CN | 103323434 | 9/2013 |

(Continued)

OTHER PUBLICATIONS

Yosuke Kanai et al., "Charge separation in nanoscale photovoltaic materials: recent insights from first-principles electronic structure theory," Journal of Materials Chemistry, Oct. 1, 2009, pp. 1053-1061.

(Continued)

*Primary Examiner* — Christopher P McAndrew
*Assistant Examiner* — Zannatul Ferdous
(74) *Attorney, Agent, or Firm* — JCIPRNET

(57) ABSTRACT

A method for inspecting light-emitting diodes (LEDs) including following steps is provided. A plurality of LEDs are provided. A charge distribution, an electrical field distribution, or a voltage distribution on the LEDs that are irradiated by an illumination beam at the same time are inspected by a sensing probe, so as to determine electro-optical characteristics of the LEDs. Besides, an inspection apparatus is also provided.

20 Claims, 14 Drawing Sheets

(56) References Cited

U.S. PATENT DOCUMENTS

| | | | | |
|---|---|---|---|---|
| 2014/0267683 A1* | 9/2014 | Bibl | ........................ | G09G 3/006 |
| | | | | 348/87 |
| 2015/0346524 A1 | 12/2015 | Afshari et al. | | |
| 2020/0091016 A1* | 3/2020 | Horikiri | .................. | G01N 21/64 |
| 2020/0278295 A1* | 9/2020 | Hansen | .................. | G01B 11/27 |
| 2020/0335847 A1* | 10/2020 | Saily | ...................... | H01Q 21/08 |

FOREIGN PATENT DOCUMENTS

| | | |
|---|---|---|
| CN | 205353177 | 6/2016 |
| TW | 201003063 | 1/2010 |
| TW | I467500 | 1/2015 |
| WO | 2014132341 | 9/2014 |

OTHER PUBLICATIONS

"Office Action of Taiwan Counterpart Application," with machine English translation thereof, dated Aug. 13, 2019, p. 1-p. 8.
"Office Action of Taiwan Counterpart Application", dated Mar. 18, 2020, p. 1-p. 8.

\* cited by examiner

_US 11,002,783 B2_

METHOD FOR INSPECTING LIGHT-EMITTING DIODES AND INSPECTION APPARATUS

CROSS-REFERENCE TO RELATED APPLICATION

This application claims the priority benefit of Taiwan application serial no. 107146378, filed on Dec. 21, 2018. The entirety of the above-mentioned patent application is hereby incorporated by reference herein and made a part of this specification.

TECHNICAL FIELD

The disclosure relates to a method for inspecting light-emitting diodes (LEDs) and an inspection apparatus.

BACKGROUND

With the development of the light-emitting diode (LED) display technology, the size of the LED die has been gradually reduced to micrometers (μm). In case of transferring a significant amount of the LEDs, high yields of the LEDs must be ensured to avoid subsequent repair of the back-end products. If the size of the LED dies is extremely small, it is almost unlikely to perform the repairing action, which causes defects in the display, affects the process yield, and further increase the cost. Therefore, how to screen out the normal function dies, or further screen out the LED dies into groups according to a specified criterion is an important inspection technology.

As the overall size of the LEDs is reduced, the size of the electrodes of the LEDs is also reduced. Therefore, when detecting the LEDs, the probe of the inspection apparatus is not easily aligned with the electrodes of the LEDs, and the tip of the probe needs to have a very small size so as to match the size of the electrodes of the LEDs. It is not easy to manufacture the probe with a very small tip, and the tip of the probe needs to be in contact with the electrodes of the LEDs during the inspection process; therefore, the probe is very likely to be damaged. In addition, in a general inspection method, the probe is required to be sequentially in contact with the electrodes of the LEDs, and thus the inspection process takes time and labor.

SUMMARY

The disclosure provides a method for inspecting light-emitting diodes (LEDs), so as to rapidly inspect a significant amount of LEDs.

The disclosure provides an inspection apparatus capable of rapidly inspecting a significant amount of LEDs.

In an embodiment of the disclosure, a method for inspecting LEDs includes following steps. A plurality of LEDs are provided. A charge distribution, an electrical field distribution, or a voltage distribution on the LEDs that are irradiated by an illumination beam at the same time are inspected by a sensing probe, so as to determine electro-optical characteristics of the LEDs.

In an embodiment of the disclosure, an inspection apparatus is configured to inspect a plurality of LEDs. The inspection apparatus includes an illumination light source, a sensing probe, and a processing device. The illumination light source emits the illumination beam, so as to simultaneously irradiate the LEDs. The sensing probe is configured to measure a charge distribution, an electric field distribution, or a voltage distribution on the LEDs simultaneously irradiated by the illumination beam. The processing device determines a plurality of electro-optical characteristics of the LEDs through the charge distribution, the electric field distribution, or the voltage distribution on the LEDs simultaneously irradiated by the illumination beam.

In view of the above, in the method for inspecting the LEDs and the inspection apparatus provided in one or more embodiments of the disclosure, the illumination beam is applied to simultaneously irradiate the LEDs, and a sensing probe is applied to measure the charge distribution, the electric field distribution, or the voltage distribution on the LEDs, so as to determine the electro-optical characteristics of the LEDs. As such, a significant amount of LEDs can be rapidly inspected.

Several exemplary embodiments accompanied with figures are described in detail below to further describe the disclosure in details.

DETAILED DESCRIPTION OF DISCLOSED EMBODIMENTS

Figure 1:
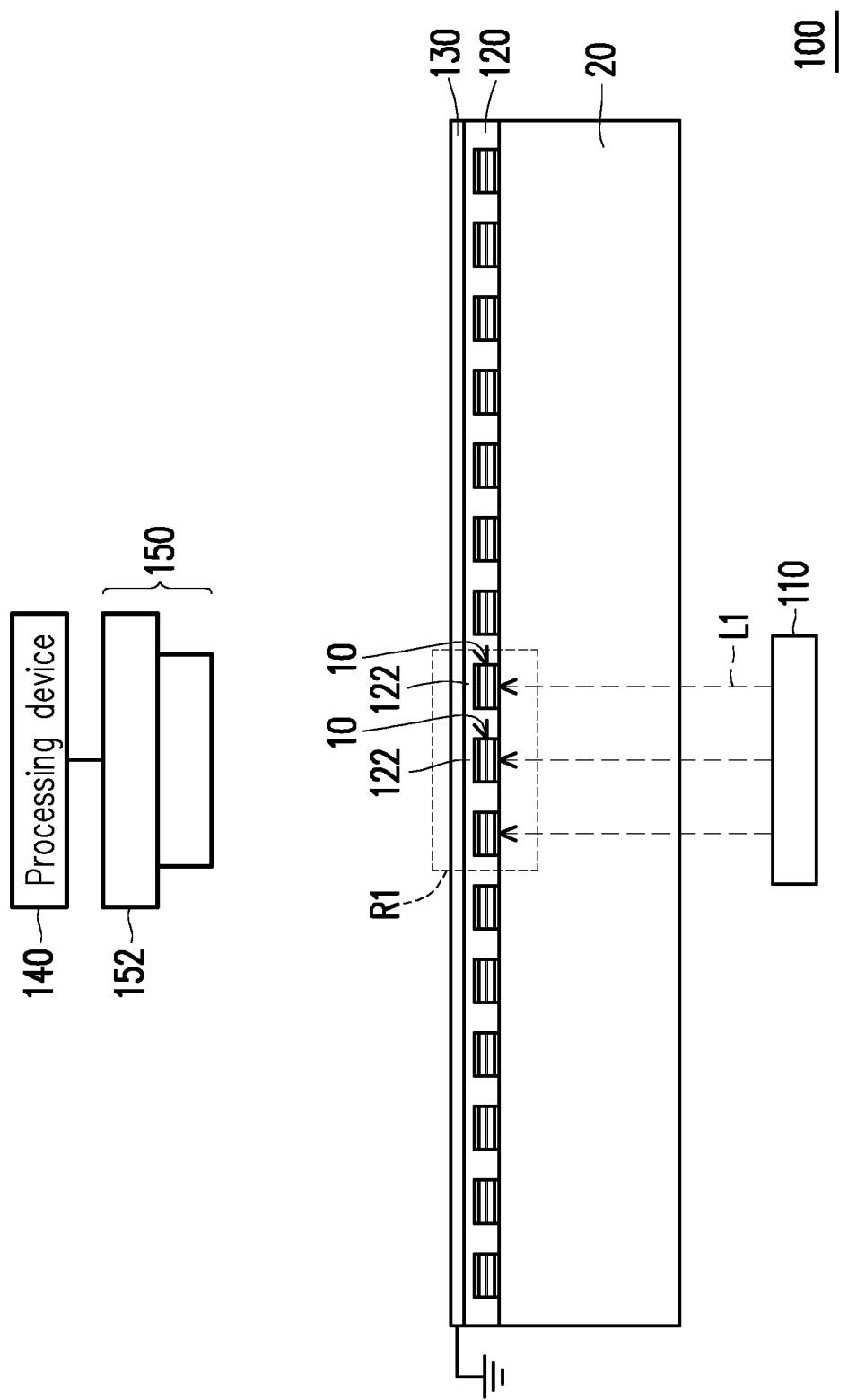
FIG. 1 is a schematic view of an inspection apparatus 100 according to an embodiment of the disclosure.

Descriptions provided in the disclosure are given with reference to the exemplary embodiments illustrated with accompanied drawings, wherein same or similar parts are denoted with same reference numerals. Wherever possible, the same reference numbers are used in the drawings and the description to refer to the same or like parts.

Figure 2:
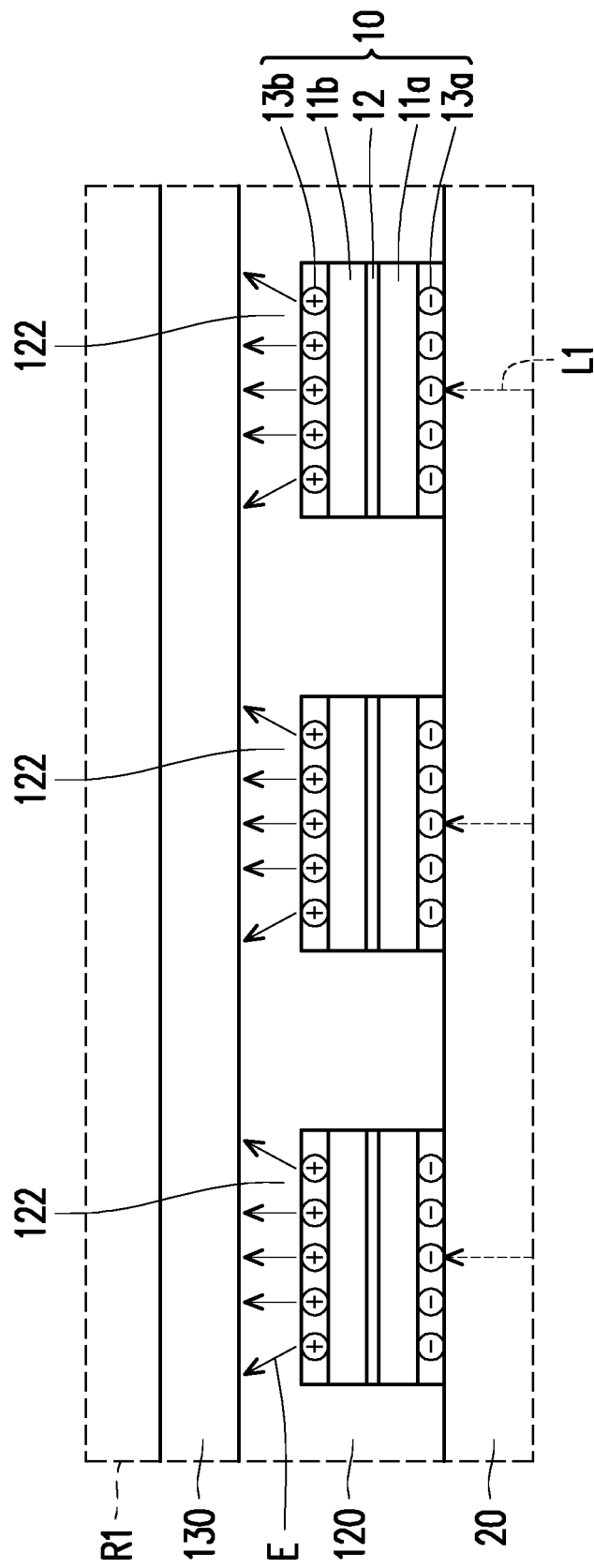
FIG. 2 is a schematic enlarged view of the partial region R1 depicted in FIG. 1.

FIG. 1 is a schematic view of an inspection apparatus 100 according to an embodiment of the disclosure. FIG. 2 is a schematic enlarged view of the partial region R1 depicted in FIG. 1.

With reference to FIG. 1, the inspection apparatus 100 is configured to inspect a plurality of light-emitting diodes (LEDs) 10. The LEDs 10 may be micro LEDs, mini LEDs, or LEDs of other sizes. In the present embodiment, the to-be-tested LEDs 10 can be selectively disposed on a carrier 20. For instance, the carrier 20 may be a wafer, which should however not be construed as a limitation in the disclosure.

With reference to FIG. 2, the LED 10 includes a first-type semiconductor layer 11a, a second-type semiconductor layer 11b, an active layer 12 disposed between the first-type semiconductor layer 11a and the second-type semiconductor layer 11b, an electrode 13a electrically connected to the first-type semiconductor layer 11a, and an electrode 13b electrically connected to the second-type semiconductor layer 11b. For instance, in the present embodiment, the two electrodes 13a and 13b of the LED 10 can be respectively disposed on two opposite sides of the first-type semiconductor layer 11a. That is, in the present embodiment, the LED 10 is a vertical LED, for instance. This should however not be construed as a limitation in the disclosure; according to other embodiments, the LED 10 may also be a horizontal LED, a flip-chip LED, or an LED of other types.

With reference to FIG. 1 and FIG. 2, in the present embodiment, the inspection apparatus 100 may selectively include a medium layer 120. The medium layer 120 is adapted to be affected by an electric field E (depicted in FIG. 2), a charge, or a voltage to induce a corresponding optical property change. The medium layer 120 is disposed on or over the LEDs 10. The medium layer 120 adjoins the LEDs 10 and has a plurality of inspection regions 122 respectively corresponding to the LEDs 10. For instance, each inspection region 122 may refer to a portion of the medium layer 120 overlapped with a corresponding LED 10. Alternatively, in the present embodiment, the medium layer 120 may be directly disposed on the LEDs 10. The medium layer 120 is, for instance, formed on the LEDs 10 through coating. Namely, the medium layer 120 can selectively be in contact with the LEDs 10. This should however not be construed as a limitation in the disclosure; according to other embodiments, the medium layer 120 may also be formed on the LEDs in another manner, and it is also likely for the medium layer 120 not to be direct contact with the LEDs. In brief, the medium layer 120 should be disposed at a location where can be affected by the electric field E, the charge, or the voltage to induce the corresponding optical property change.

In the present embodiment, the inspection apparatus 100 can selectively include a conductive layer 130. The conductive layer 130 is disposed on the medium layer 120, and the medium layer 120 is located between the conductive layer 130 and the LEDs 10. In the present embodiment, the conductive layer 130 is transparent and is selectively grounded, which should however not be construed as a limitation in the disclosure.

The inspection apparatus 100 includes an illumination light source 110. The illumination light source 110 is configured to emit an illumination beam L1, so as to simultaneously irradiate the LEDs 10. The wavelength of the illumination beam L1 is less than or equal to a light-emitting wavelength of the LEDs 10. The illumination beam L1 can induce photovoltaic effects of the LEDs 10. In the present embodiment, the illumination beam L1 may selectively have uniform light intensity. Namely, the irradiated amount of each LED 10 simultaneously irradiated by the illumination beam L1 is substantially the same, which should however not be construed as a limitation in the disclosure.

In the present embodiment, the illumination light source 110 can be selectively disposed below the LEDs 10, and the illumination beam L1 can irradiate the LEDs 10 from the surfaces of the LEDs 10, which face the illumination light source 110. This should however not be construed as a limitation in the disclosure; according to other embodiments, the illumination light source 110 can also be disposed at another proper location, and the illumination beam L1 can also irradiate the LEDs 10 from the front surface, the side surfaces, or both of the LEDs 10.

In the present embodiment, the inspection apparatus 100 may also include a processing device 140 and an optical image capturing portion 150. The optical image capturing portion 150 at least includes an optical-electro sensor 152 and an image capturing light source 154 (shown in at least one of FIG. 5A to FIG. 7B), wherein the image capturing light source 154 emits an image capturing beam L2 (shown in at least one of FIG. 5A to FIG. 7B) to irradiate the medium layer 120. The optical-electro sensor 152 and the processing device 140 are electrically connected. For instance, in the present embodiment, the optical image capturing portion 150 may include a camera and an image capturing lens assembly, and the processing device 140 may be a computer, which should however not be construed as a limitation in the disclosure.

The processing device 140 determines a plurality of electro-optical characteristics of the LEDs 10 through the charge distribution, the electric field distribution, or the voltage distribution on the LEDs 10 simultaneously irradiated by the illumination beam L1. For instance, in the present embodiment, when the illumination beam L1 simultaneously irradiate the LEDs 10, charges are accumulated on the electrode 13b of at least one of the LEDs 10, and the accumulated charges induce the electric field E and the voltage. The medium layer 120 is affected by the electric field E, the charge, or the voltage and thus induces physical or chemical changes, which leads to the corresponding optical property change to the medium layer 120. The optical-electro sensor 152 obtains an image of inspection regions 122 of the medium layer 120 corresponding to the LEDs 10 when the illumination beam L1 simultaneously irradiates the LEDs 10. The processing device 140 determines electro-optical characteristics of the LEDs 10 according to the image.

For instance, if the LED 10 is operated normally, due to the photovoltaic effect, a voltage difference is generated between the two electrodes 13a and 13b of the functional LED 10, and the electric field E may be generated between the electrode 13b of the LED 10 and the conductive layer 130 located on the medium layer 120; affected by the electric field E, the charge, or the voltage, a portion of the image of the inspection regions 122 of the medium layer 120 corresponding to the functional LED 10 becomes a predicted image (e.g., bright zone). By contrast, if the LED 10 cannot work, no voltage can be generated between the electrodes 13a and 13b of the non-functional LED 10, and no electric field E, charge, or voltage is generated between the electrode 13b of the non-functional LED 10 and the conductive layer 130 located on the medium layer 120. At this time, a portion of the image of the inspection regions 122 of the medium layer 120 corresponding to the non-functional LED 10 becomes an unpredicted image (e.g., dark zone). Thereby, it can be determined whether the LED 10 is functional It should be mentioned that in the aforesaid inspection method, the illumination light source 110 simultaneously irradiates a plurality of LEDs 10, and the optical-electro sensor 152 simultaneously obtains the image of the inspection regions 122 of the medium layer 120. Unlike the normal inspection apparatus, the inspection apparatus 100 need not have the probe sequentially contacted with the electrodes 13b of the LEDs 10. Accordingly, a significant amount of LEDs 10 can be rapidly inspected. Moreover, in said inspection method, the steps of irradiating the LEDs 10 and obtaining the image of the inspection regions 122 do not require the actual contact with the LEDs 10; therefore, the possibility of damaging the LEDs 10 during the inspection can be reduced. Besides, the probe used when applying the normal inspection method is required to be aligned to the electrodes of the LEDs, and thus the tip of the probe may be worn. Said issue can be prevented in the disclosure.

Note that the method of inspecting the LEDs 10 and the inspection apparatus 100 not only can inspect whether the LEDs 10 normally function but also can be applied to inspect the electro-optical characteristics of the LEDs 10. For instance, due to the manufacturing variations, the electro-optical characteristics of the LEDs 10 are different; at this time, when the illumination beam L1 with the same intensity is applied to irradiate the LEDs 10, the electric fields, the charges, or the voltages generated by the LEDs 10 are different, and thus the changes of optical properties of the medium layer 120 are in different degrees; as such, the brightness or the colors of portions of the image of the inspection regions 122 respectively corresponding to the LEDs 10 are different. Thereby, whether the electro-optical characteristics of the LEDs 10 are good or not, and the LEDs 10 can then be classified.

Figure 3:
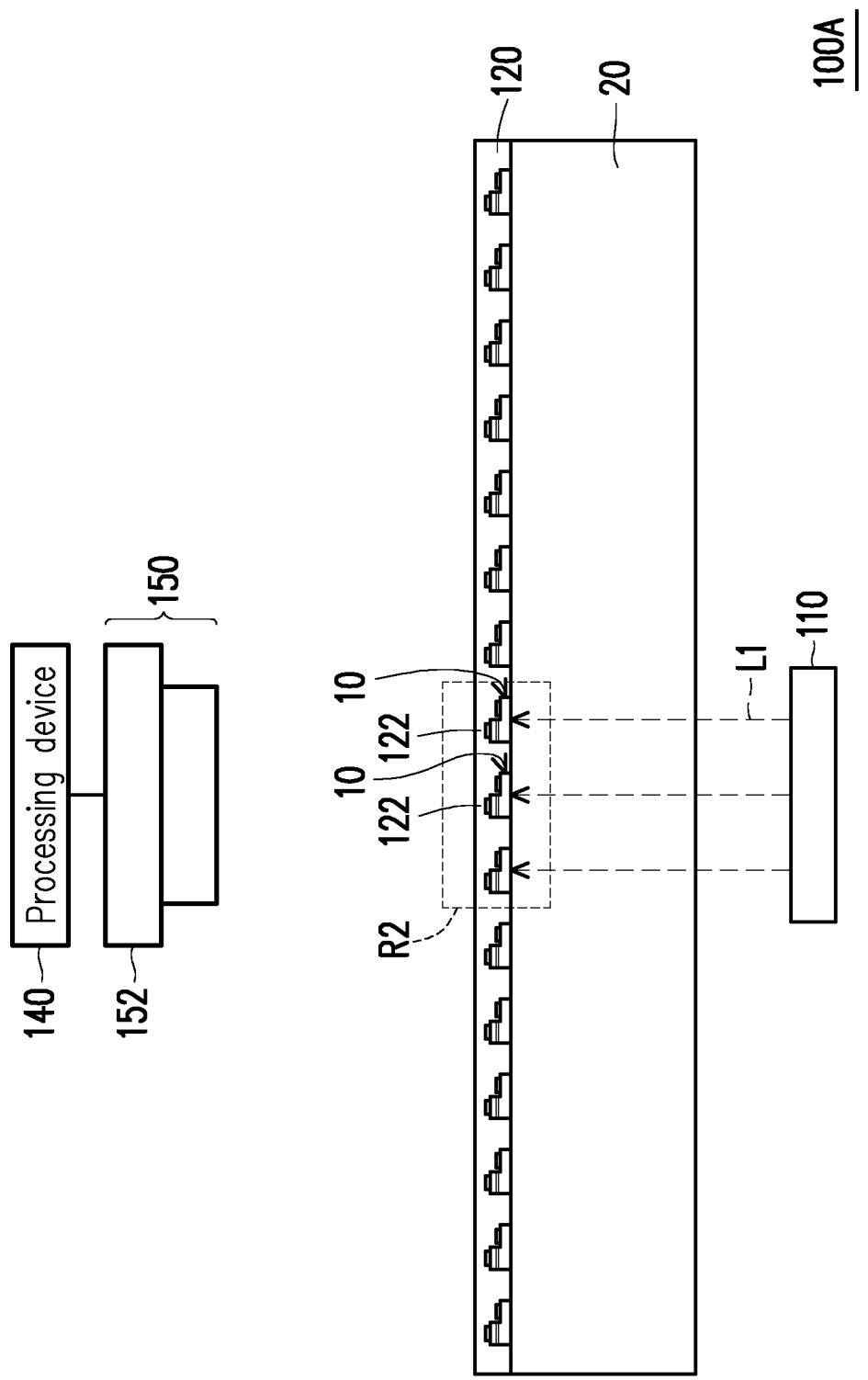
FIG. 3 is a schematic view of an inspection apparatus 100A according to another embodiment of the disclosure.
Figure 4:
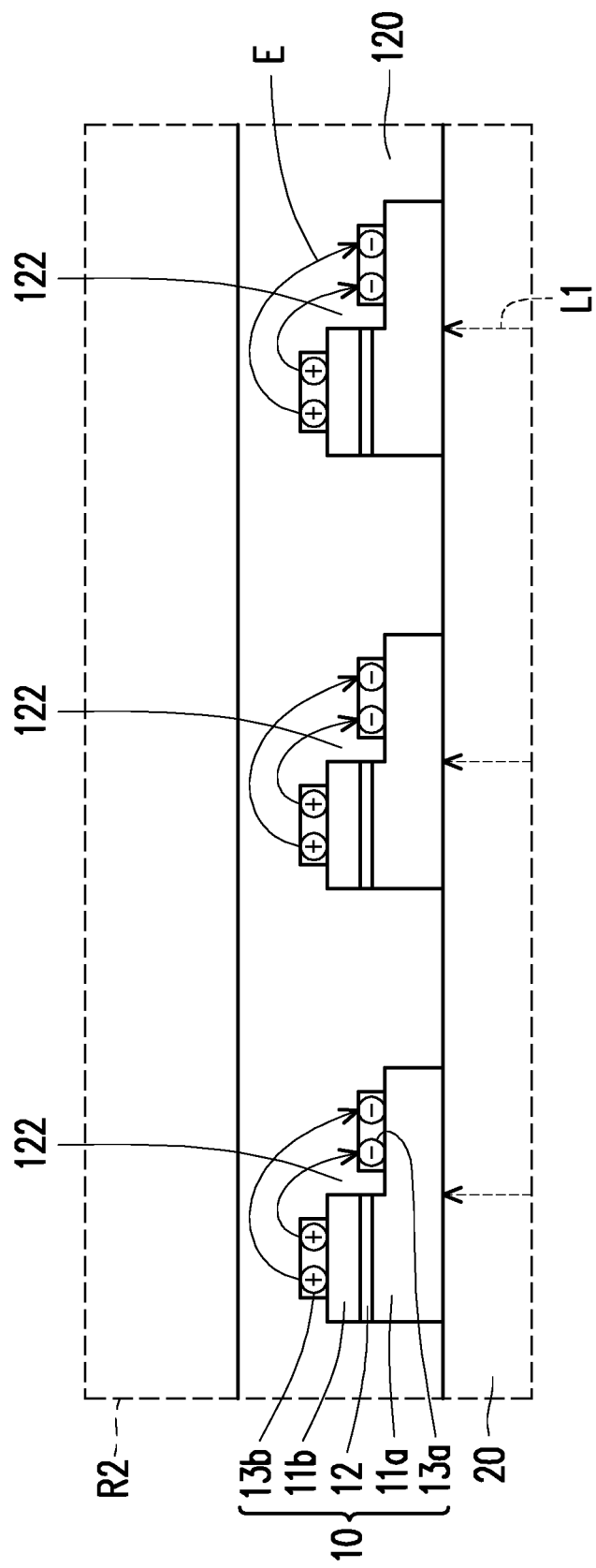
FIG. 4 is a schematic enlarged view of the partial region R2 depicted in FIG. 3.

FIG. 3 is a schematic view of an inspection apparatus 100A according to another embodiment of the disclosure. FIG. 4 is a schematic enlarged view of the partial region R2 depicted in FIG. 3. The inspection apparatus 100A and a method for inspecting the same provided in the present embodiment are similar to the inspection apparatus 100 and the method for inspecting the same, while the difference therebetween lies in that the inspection apparatus 100A is adapted to inspect the horizontal LEDs 10. The two electrodes 13a and 13b of the horizontal LED 10 are located on the same side of the first-type semiconductor layer 11a. In the present embodiment, the medium layer 120 may be affected by the electric field E, the charge, or the voltage generated by the two electrodes 13a and 13b of the horizontal LED 10, and there may be no conductive layer 130 on the medium layer 120. According to the embodiment depicted in FIG. 3, the optical image capturing portion 150 of the inspection apparatus 100A also includes an image capturing light source 154 (depicted in at least one of FIG. 5A to FIG. 7B), wherein the image capturing light source 154 emits the image capturing beam L2 (depicted in at least one of FIG. 5A to FIG. 7B) to irradiate the medium layer 120.

The medium layer 120 provided in any of the previous embodiments may be a film layer capable of affecting by the electric field E, the charge, or the voltage to experience the physical or chemical changes, which induces the corresponding optical property change. For instance, the medium layer 120 may be a liquid crystal (LC) layer, an electrochromic layer, an electro-wetting layer, a suspended particle device (SPD) layer, voltage-sensing nanoparticles, or a voltage sensitive dye, or the medium layer 120 may be made of other materials. Here, the LC layer may be a polymer dispersed liquid crystal (PDLC) layer, a twisted nematic liquid crystal (TNLC) layer, a super twisted nematic (STN) liquid crystal layer, a vertical alignment (VA) liquid crystal layer, or a liquid crystal layer in another form.

The inspection method is elaborated hereinafter, given that the medium layer 120A is an LC layer, and the medium layer 120B is an electrochromic layer or a voltage sensitive dye, for instance.

Figure 5A:
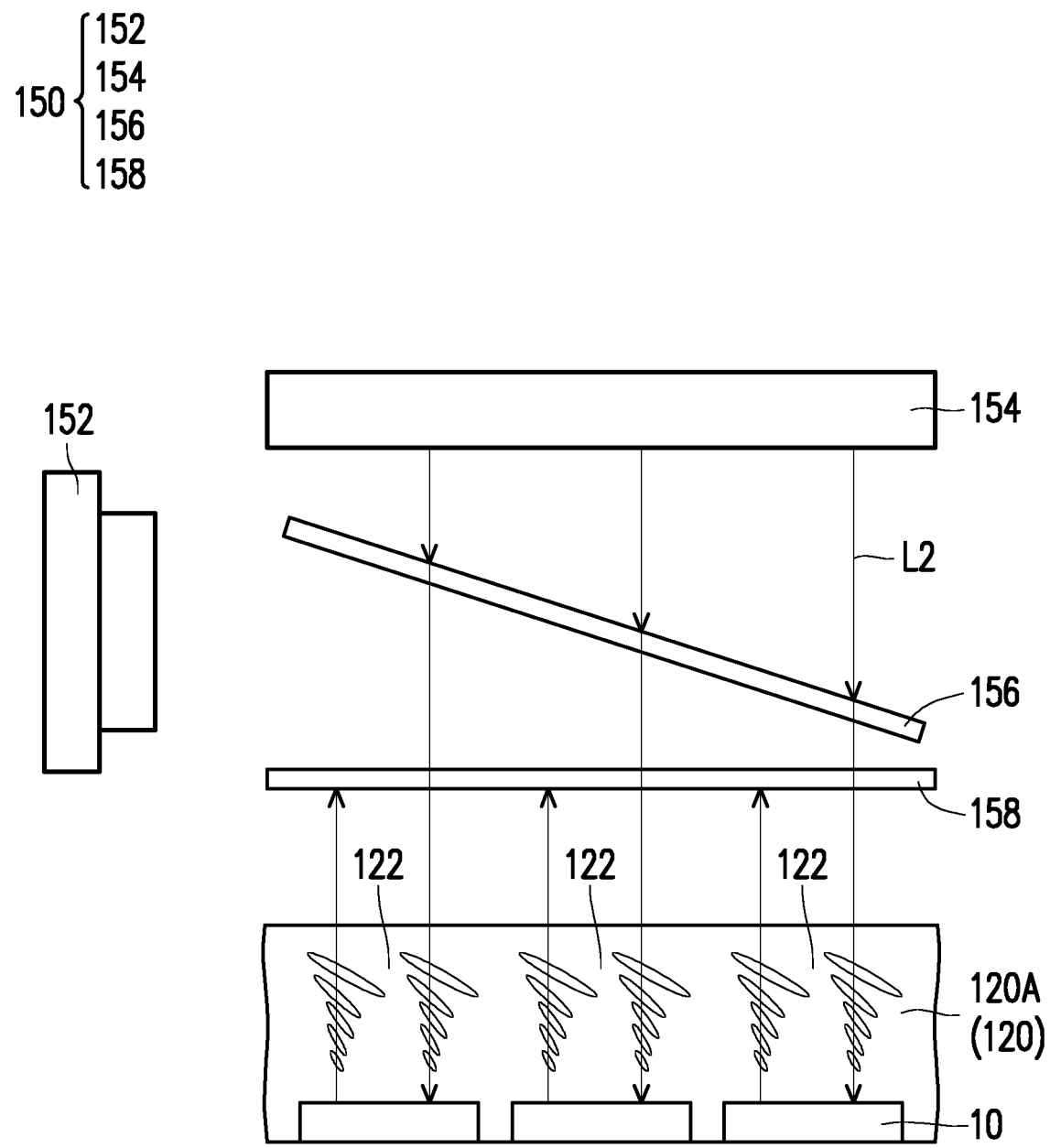
FIG. 5A is a schematic view of a plurality of light-emitting diodes (LEDs) 10, a medium layer 120A, and an optical image capturing portion 150 according to an embodiment of the disclosure.
Figure 5B:
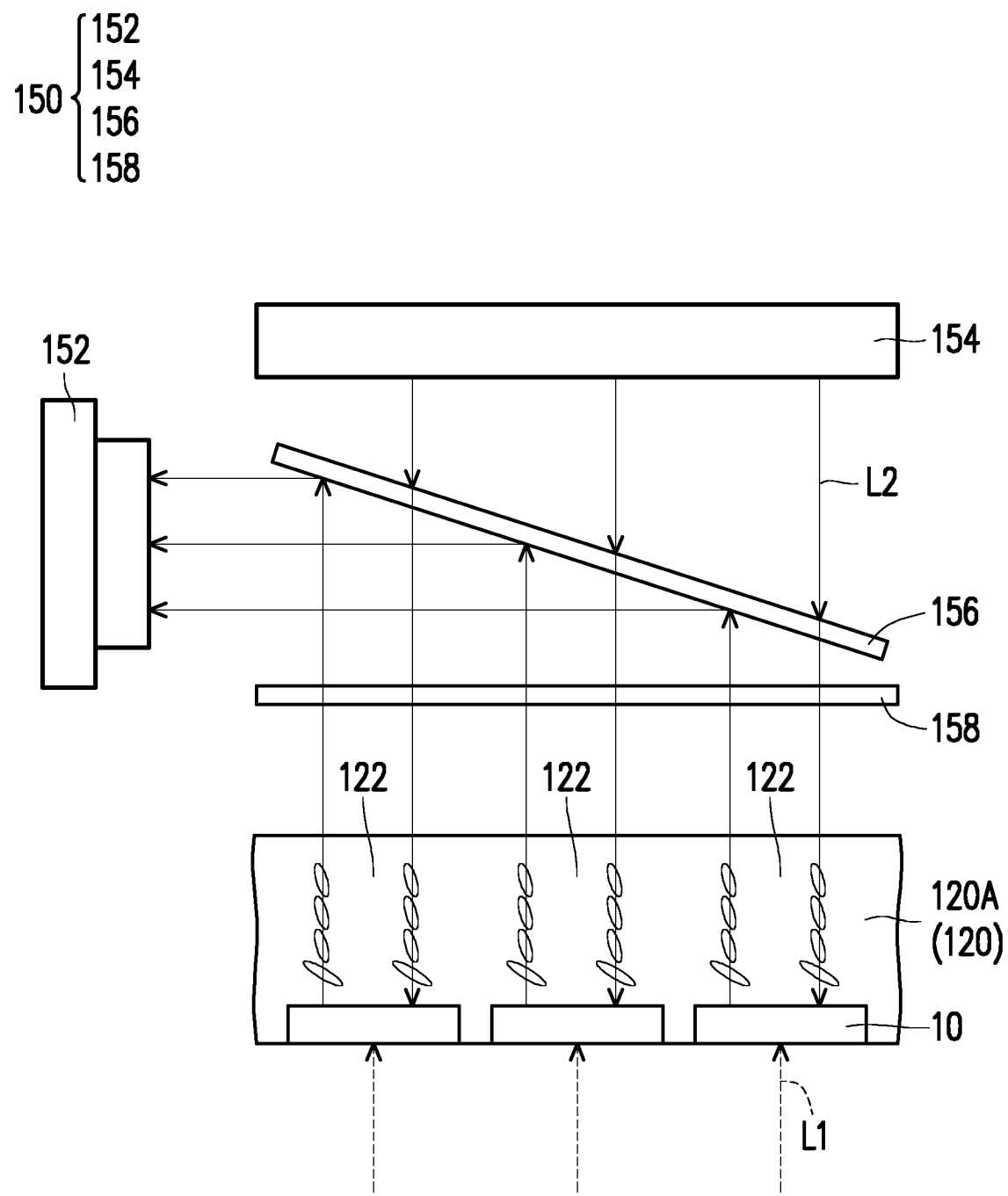
FIG. 5B is a schematic view of a plurality of LEDs 10, a medium layer 120A, and an optical image capturing portion 150 according to an embodiment of the disclosure.

FIG. 5A and FIG. 5B are schematic views of the LEDs 10, the medium layer 120A, and the optical image capturing portion 150 according to an embodiment of the disclosure, wherein the LEDs 10 depicted in FIG. 5A are not irradiated by the illumination beam L1, and the LEDs 10 depicted in FIG. 5B are irradiated by the illumination beam L1.

With reference to FIG. 5A and FIG. 5B, in the present embodiment, the medium layer 120A is a liquid crystal layer (including but not limited to twisted nematic liquid crystal). The optical image capturing portion 150 not only includes the optical-electro sensor 152 and an imaging lens but also selectively includes an image capturing light source 154 and a polarizing device 158. The image capturing light source 154 is configured to emit the image capturing beam L2. The polarizing device 158 is disposed on the medium layer 120A. The medium layer 120A is located between the polarizing device 158 and the LEDs 10.

After the LEDs 10 are irradiated by the illumination beam L1, due to the photovoltaic effect, charges are accumulated on the electrodes of the LEDs 10 (not shown in FIG. 5A and FIG. 5B), thus inducing the electric field (not shown in FIG. 5A and FIG. 5B) and allowing liquid crystal molecules in the liquid crystal layer (i.e., the medium layer 120A) to reorient. The image capturing light source 154 emits the image capturing beam L2. The image capturing beam L2 passes through the polarizing device 158 above the medium layer 120A and is polarized. The polarized image capturing beam L2 sequentially passes through the liquid crystal layer (i.e., the medium layer 120A), is reflected by the LEDs 10 or other components (e.g., an upper electrode), and is again transmitted to the polarizing device 158. Due to the manufacturing variations, the electro-optical characteristics of the LEDs 10 are different; at this time, the electric fields generated by the LEDs 10 irradiated by the illumination beam L1 with the same intensity are different, so that the liquid crystal molecules in the inspection regions 122 of the medium layer 120A are reoriented in different levels. That is, the phases of the image capturing beam L2 changed by the inspection regions 122 of the medium layer 120A are different. Hence, when the image capturing beam L2 is again transmitted to the polarizing device 158, the intensity distribution of image capturing beam L2 passing through the polarizing device 158 may be changed. Thereby, the brightness distribution of the image of the inspection regions 122 obtained by the optical-electro sensor 152 may be different, so as to deduce the difference in the electro-optical characteristics of the LEDs 10 from the image; alternatively, whether the LEDs 10 are functional and operated normally can be deduced from the image of the inspection regions 122 obtained by the optical-electro sensor 152.

In the present embodiment, the image capturing beam L2 may irradiate the medium layer 120A from the top of the LEDs 10, and the optical image capturing portion 150 may selectively include a beam splitter 156 disposed between the image capturing light source 154 and the polarizing device 158. The beam splitter 156 can reflect the image capturing beam L2 passing through the medium layer 120A and then passing through the polarizing device 158, and the optical-electro sensor 152 can be disposed on the upper-left side or the upper-right side of the LEDs 10, so as to receive the image capturing beam L2 reflected by the beam splitter 156. This should however not be construed as a limitation in the disclosure; according to other embodiments, the image capturing beam L2 may also irradiate the medium layer 120A from the side of the LEDs 10, and the optical-electro sensor 152 can also be disposed above the LEDs 10.

Figure 6A:
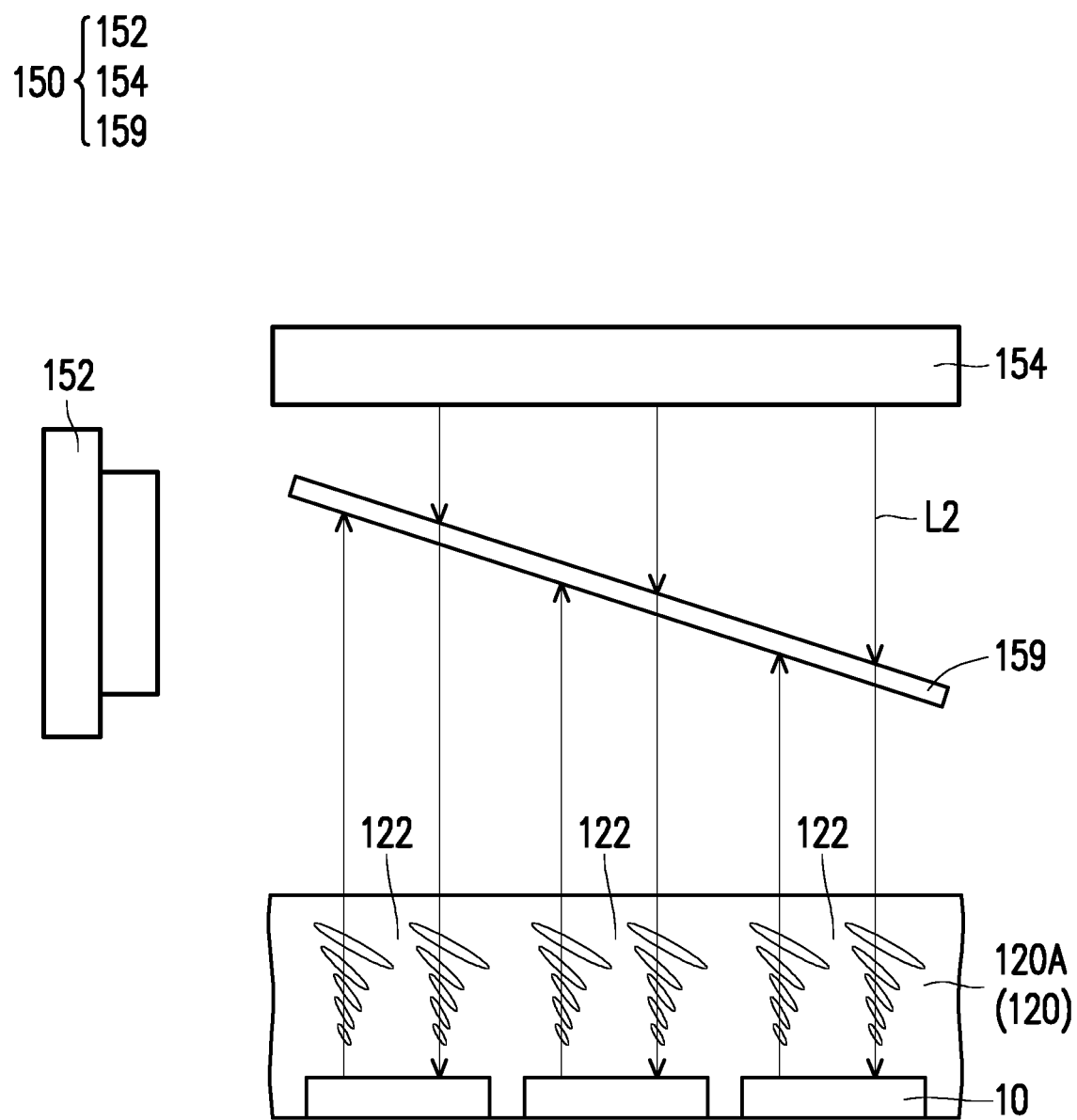
FIG. 6A is a schematic view of a plurality of LEDs 10, a medium layer 120A, and an optical image capturing portion 150 according to another embodiment of the disclosure.
Figure 6B:
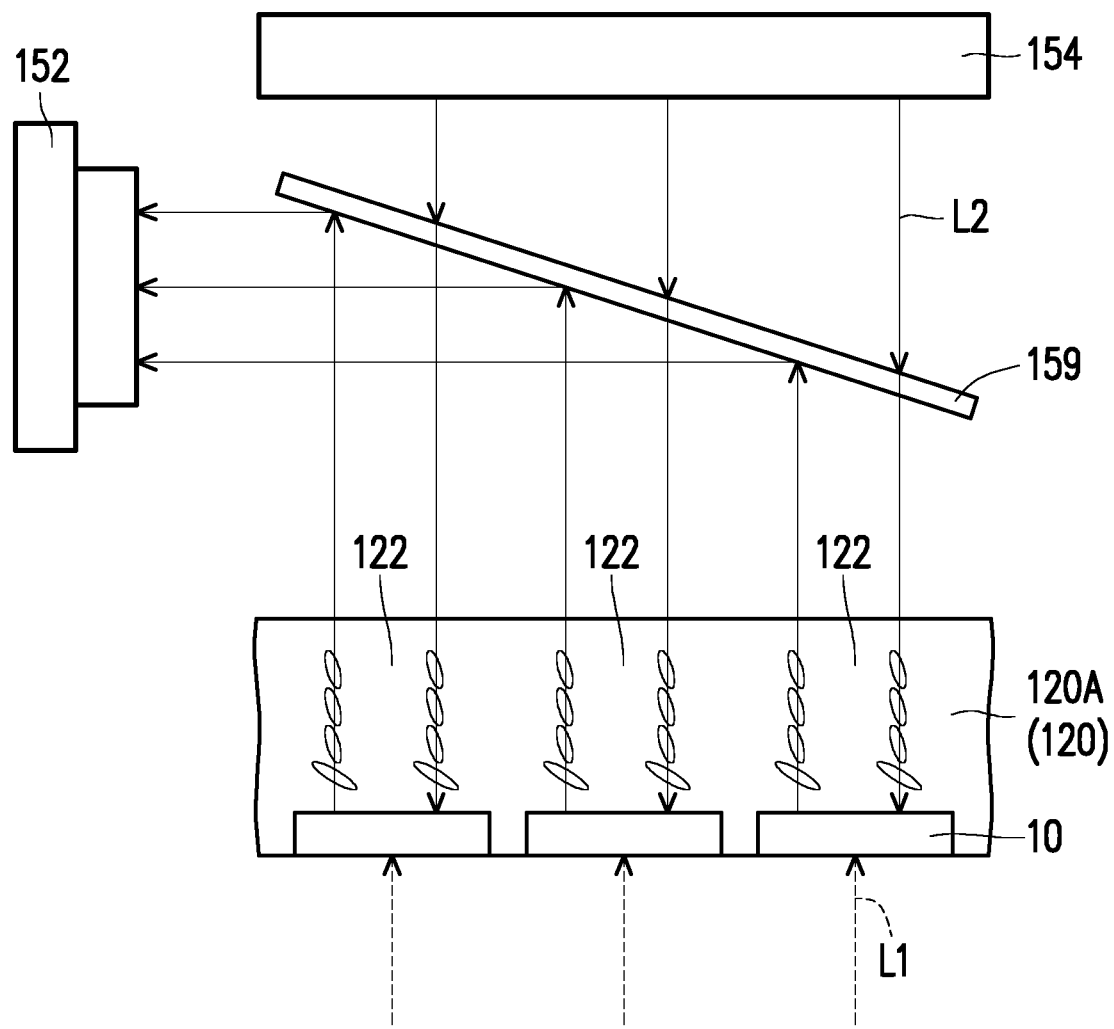
FIG. 6B is a schematic view of a plurality of LEDs 10, a medium layer 120A, and an optical image capturing portion 150 according to another embodiment of the disclosure.

FIG. 6A and FIG. 6B are schematic views of the LEDs 10, the medium layer 120A, and the optical image capturing portion 150 according to another embodiment of the disclosure, wherein the LEDs 10 depicted in FIG. 6A are not irradiated by the illumination beam L1, and the LEDs 10 depicted in FIG. 6B are irradiated by the illumination beam L1. The difference between the embodiment depicted in FIG. 6A and FIG. 6B and the embodiment depicted in FIG. 5A and FIG. 5B is in that the optical image capturing portion 150 depicted in FIG. 6A and FIG. 6B includes a polarizing beam splitter 159 which can replace the beam splitter 156 and the polarizing device 158 depicted in FIG. 5A and FIG. 5B.

With reference to FIG. 6A and FIG. 6B, specifically, after the LEDs 10 are irradiated by the illumination beam L1, due to the photovoltaic effect, charges are accumulated on the electrodes of the LEDs 10 (not shown in FIG. 6A and FIG. 6B), thus inducing the electric field and allowing liquid crystal molecules of the liquid crystal layer (i.e., the medium layer 120A) to reorient. The image capturing light source 154 emits the image capturing beam L2. The image capturing beam L2 passes through the polarizing beam splitter 159 above the medium layer 120A and is polarized. The polarized image capturing beam L2 sequentially passes through the liquid crystal layer (i.e., the medium layer 120A), is reflected by the LEDs 10 or other components (e.g., an upper electrode), and is again transmitted to the polarizing beam splitter 159. Due to the manufacturing variations, the electro-optical characteristics of the LEDs 10 are different; at this time, the electric fields generated by the LEDs 10 irradiated by the illumination beam L1 with the same intensity are different, so that the liquid crystal molecules in the inspection regions 122 of the medium layer 120A are reoriented in different levels. That is, the phases of the image capturing beam L2 changed by the inspection regions 122 of the medium layer 120A are different. Hence, when the image capturing beam L2 is again reflected by the polarizing beam splitter 159, the intensity distribution of the image capturing beam L2 reflected by the polarizing beam splitter 159 may be changed. Thereby, the brightness distribution of the image of the inspection regions 122 obtained by the optical-electro sensor 152 may be different, so as to deduce the difference in the electro-optical characteristics of the LEDs 10 from the image; alternatively, whether the LEDs 10 are functional and operated normally can be deduced from the image of the inspection regions 122 obtained by the optical-electro sensor 152.

In the present embodiment, the polarizing beam splitter 159 can reflect the image capturing beam L2 passing through the medium layer 120A and again transmitted to the polarizing beam splitter 159, and the optical-electro sensor 152 can be disposed on the upper-left side or the upper-right side of the LEDs 10, so as to receive the image capturing beam L2 reflected by the polarizing beam splitter 159. This should however not be construed as a limitation in the disclosure; according to other embodiments, the image capturing beam L2 may also irradiate the medium layer 120A from the side of the LEDs 10, and the optical-electro sensor 152 can also be disposed above the LEDs 10.

Figure 7A:
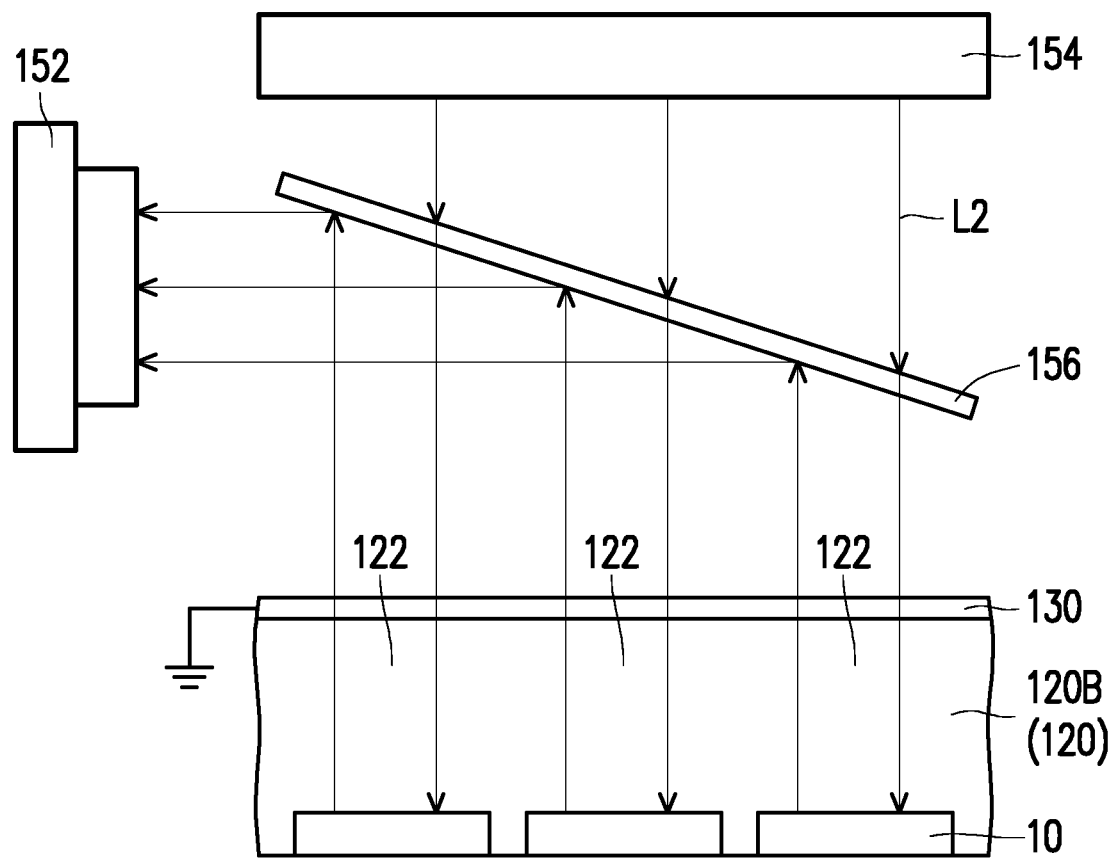
FIG. 7A is a schematic view of a plurality of LEDs 10, a medium layer 120A, and an optical image capturing portion 150 according to still another embodiment of the disclosure.
Figure 7B:
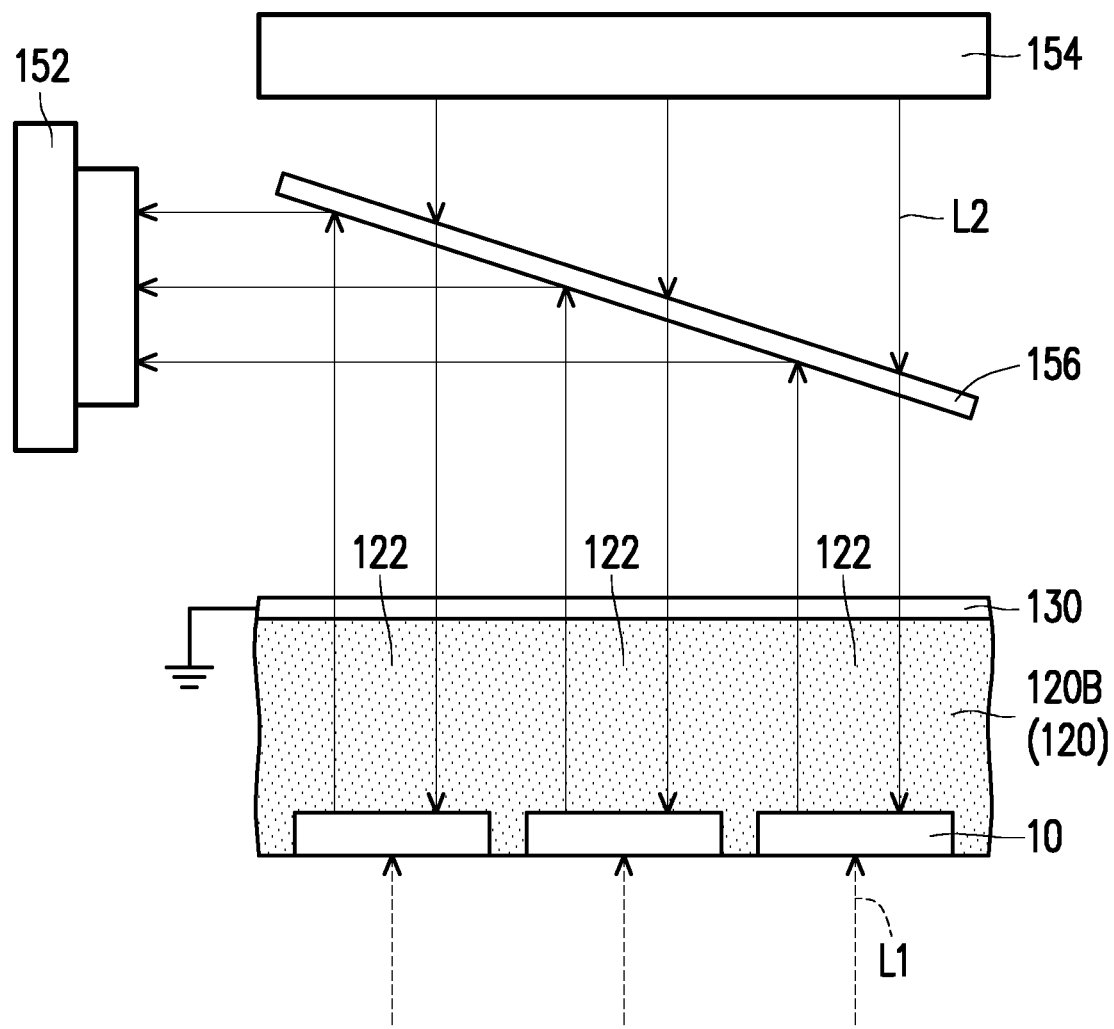
FIG. 7B is a schematic view of a plurality of LEDs 10, a medium layer 120A, and an optical image capturing portion 150 according to still another embodiment of the disclosure.

FIG. 7A and FIG. 7B are schematic views of the LEDs 10, the medium layer 120B, and the optical image capturing portion 150 according to still another embodiment of the disclosure, wherein the LEDs 10 depicted in FIG. 7A are not irradiated by the illumination beam L1, and the LEDs 10 depicted in FIG. 7B are irradiated by the illumination beam L1. The difference between the embodiment depicted in FIG. 7A and FIG. 7B and the embodiment depicted in FIG. 5A and FIG. 5B is in that the medium layer 120B shown in FIG. 7A and FIG. 7B is an electrochromic (EC) layer or a voltage sensitive dye, while the optical image capturing portion 150 depicted in FIG. 7A and FIG. 7B may also include the image capturing light source 154 but may not include the polarizing device 158.

With reference to FIG. 7A and FIG. 7B, after the LEDs 10 are irradiated by the illumination beam L1, due to the photovoltaic effect, charges are accumulated on the electrodes of the LEDs 10 (not shown in FIG. 7A and FIG. 7B), thus inducing the electric field (not shown in FIG. 7A and FIG. 7B) or the voltage, which results in the color change of the EC layer or the voltage sensitive dye (i.e., the medium layer 120B). The image capturing light source 154 emits the image capturing beam L2, so that the optical-electro sensor 152 is allowed to read the color change of the EC layer or the voltage sensitive dye (i.e., the medium layer 120B). Due to the manufacturing variations, the electro-optical characteristics of the LEDs 10 are different; at this time, the electric fields generated by the LEDs 10 irradiated by the illumination beam L1 with the same intensity are different, so that the color changes in the inspection regions 122 of the medium layer 120B are in different degrees. The difference in the electro-optical characteristics of the LEDs 10 and whether the LEDs 10 normally function and do not fail can be deduced from the color distribution of the light obtained through the optical-electro sensor 152, or the LEDs 10 can be classified according to the color distribution of the light obtained through the optical-electro sensor 152. In the present embodiment, the optical image capturing portion 150 not only can be a camera but also can be a color analyzer or an image spectrum reading probe that is able to directly read a color coordinate (or a light spectrum).

Figure 8:
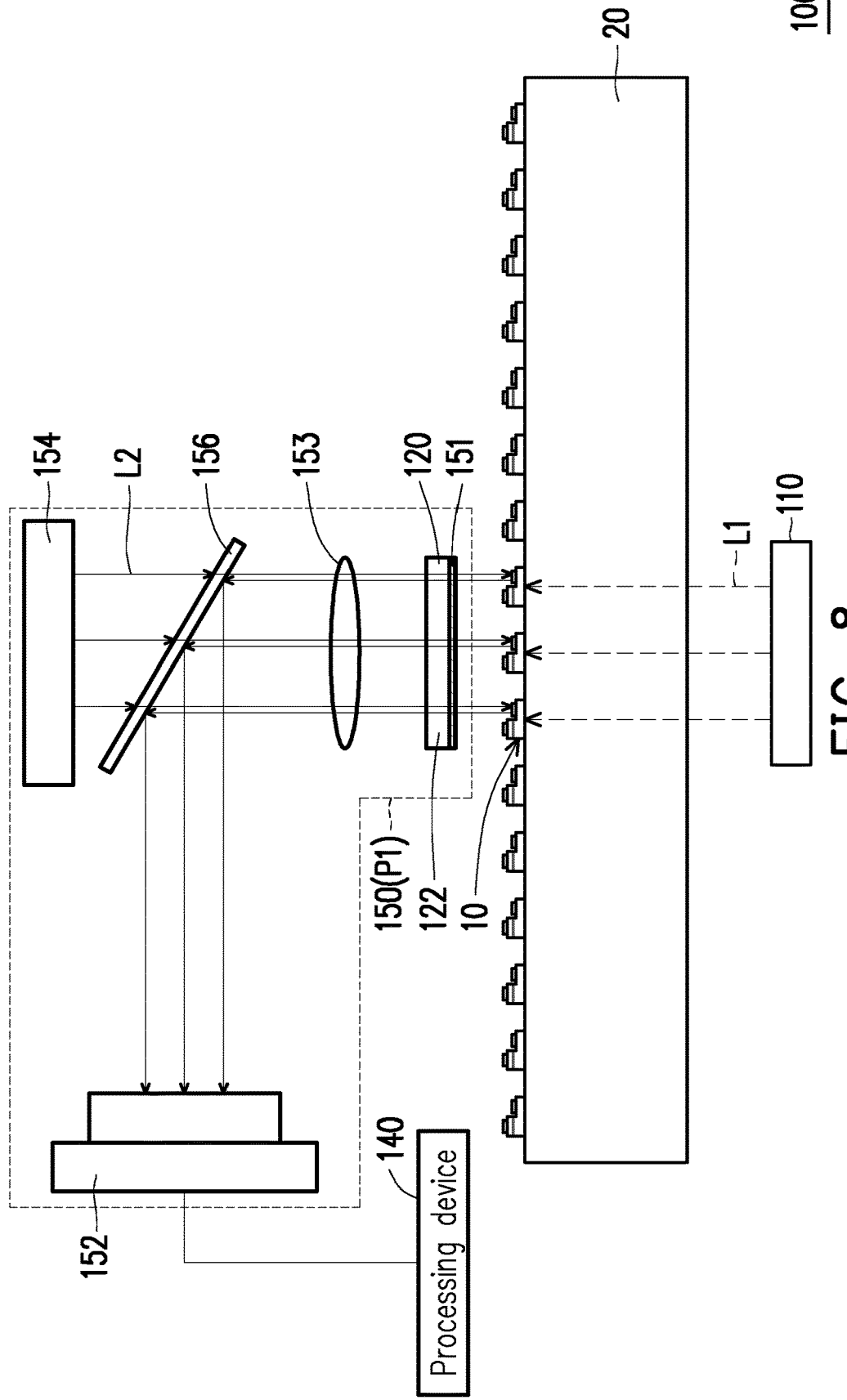
FIG. 8 is a schematic view of an inspection apparatus 100B according to still another embodiment of the disclosure.

FIG. 8 is a schematic view of an inspection apparatus 100B according to another embodiment of the disclosure. The inspection apparatus 100B is similar to the aforesaid inspection apparatus 100, while the difference therebetween is in that the medium layer 120 and the optical image capturing portion 150 can be integrated to form a sensing probe P1 according to the embodiment shown in FIG. 8. While the LEDs 10 are being inspected, the medium layer 120 of the sensing probe P1 may be arranged to be very close to the LEDs 10 (i.e., the medium layer 10 is disposed above the LEDs 10, wherein the medium layer 120 is separated from the LEDs 10), or the medium layer 120 of the sensing probe P1 is arranged to touch the LEDs 10. The sensing probe P1 can alternatively include the reflective layer 151 disposed below the medium layer 120. The reflective layer 151 can reflect the image capturing beam L2 (passing through the medium layer 120) to the optical-electro sensor 152. Moreover, the sensing probe P1 may further include a lens 153 disposed above the medium layer 120, which should however not be construed as a limitation in the disclosure.

Figure 9:
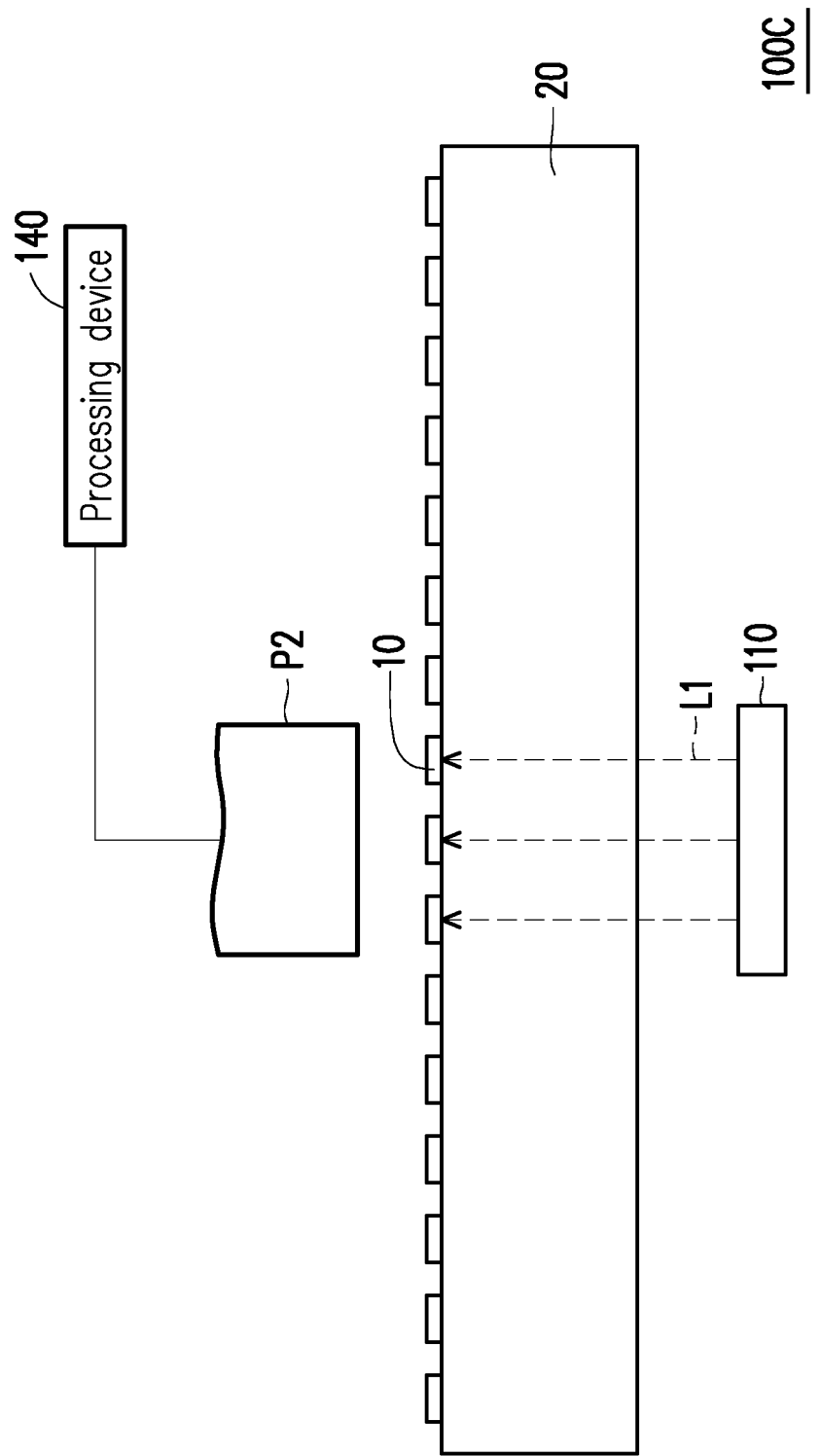
FIG. 9 is a schematic view of an inspection apparatus 100C according to still another embodiment of the disclosure.

FIG. 9 is a schematic view of an inspection apparatus 100C according to another embodiment of the disclosure. The inspection apparatus 100C is similar to the inspection apparatus 100 described above, and the difference therebetween lies in that the inspection apparatus 100C depicted in FIG. 9 may include a sensing probe P2 configured to measure a charge distribution, an electric field distribution, or a voltage distribution on the LEDs 10 simultaneously irradiated by the illumination beam L1. For instance, if the LEDs 10 may be vertical LEDs or horizontal LEDs, the sensing probe P2 may be a charge probe or an electric field or voltage measuring probe. Since the LEDs 10 described below are arranged in an array, the sensing probe P2 may be composed of a number of small charge probes or small electric field or voltage measuring probes. The inspection apparatus 100C need not include the medium layer 120 and the optical image capturing portion 150.

Note that the medium layer 120, 120A, or 120B described in some of the previous embodiments (e.g., the embodiments depicted in FIG. 1, FIG. 3, FIG. 5A, FIG. 6A, and FIG. 7A) is directly disposed on the LEDs 10. However, for easy inspection, the medium layer 120 or 120A described in some of the previous embodiments can be integrated into the sensing probe, which is exemplified in FIG. 10.

Figure 10:
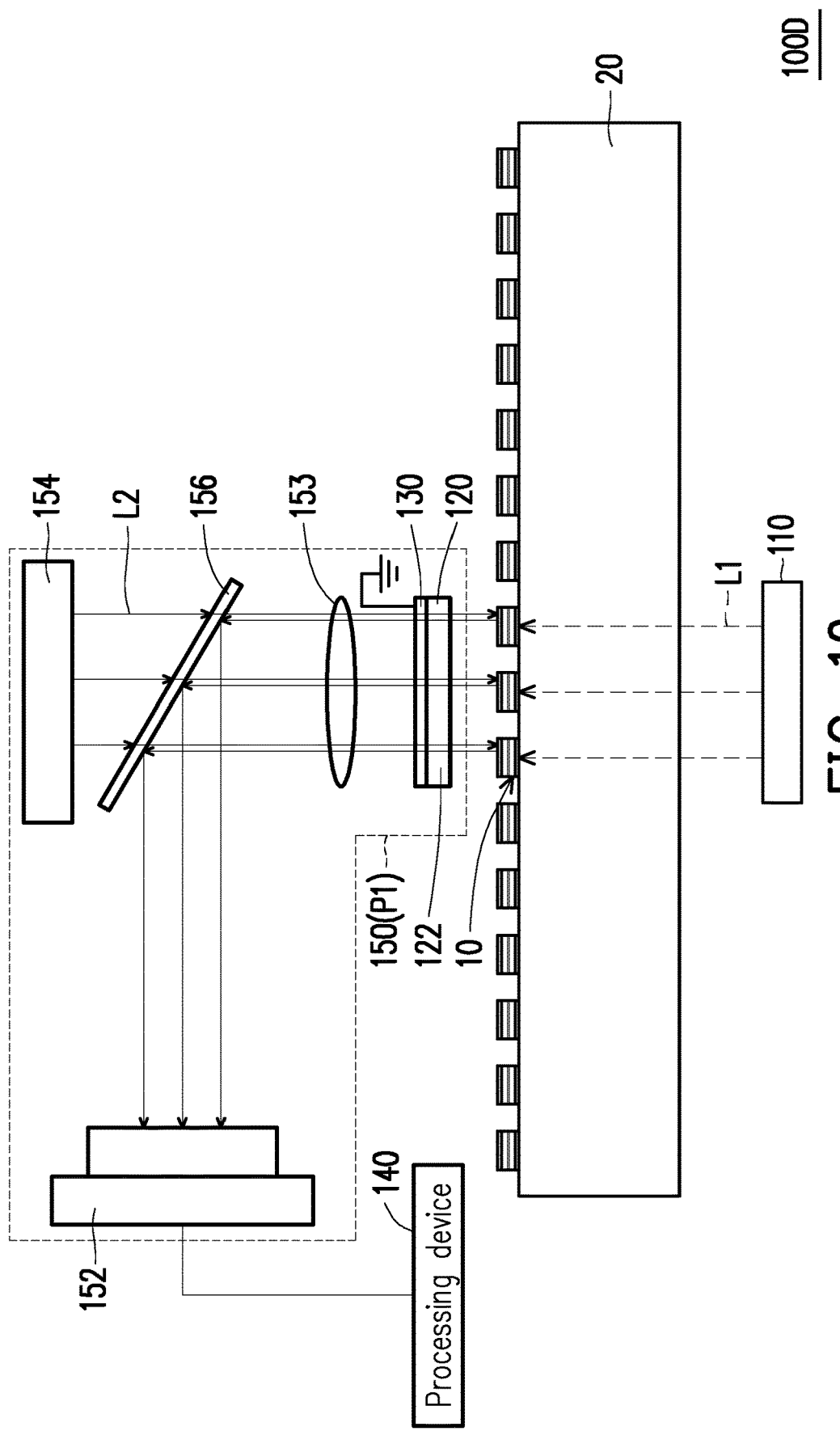
FIG. 10 is a schematic view of an inspection apparatus 100D according to an embodiment of the disclosure.

FIG. 10 is a schematic view of an inspection apparatus 100D according to an embodiment of the disclosure. The inspection apparatus 100D depicted in FIG. 10 is similar to the inspection apparatus 100A depicted in FIG. 3, while the main difference therebetween is in that the inspection apparatus 100D depicted in FIG. 10 can also integrate the medium layer 120 into the sensing probe P1, while the other components in the sensing probe P1 of the inspection apparatus 100D have been described in the previous paragraphs and thus will not be further explained.

In the embodiment of inspecting the horizontal LEDs (e.g., the embodiments depicted in FIG. 3 and FIG. 8), note that two upper surfaces of the electrodes 13a and 13b of each of the horizontal LEDs 10 are not coplanar. This should however not be construed as a limitation in the disclosure; the horizontal LEDs 10 can be inspected no matter whether the two upper surfaces of the electrodes 13a and 13b of each of the horizontal LEDs 10 are coplanar, which will be exemplarily explained below with reference to FIG. 11.

Figure 11:
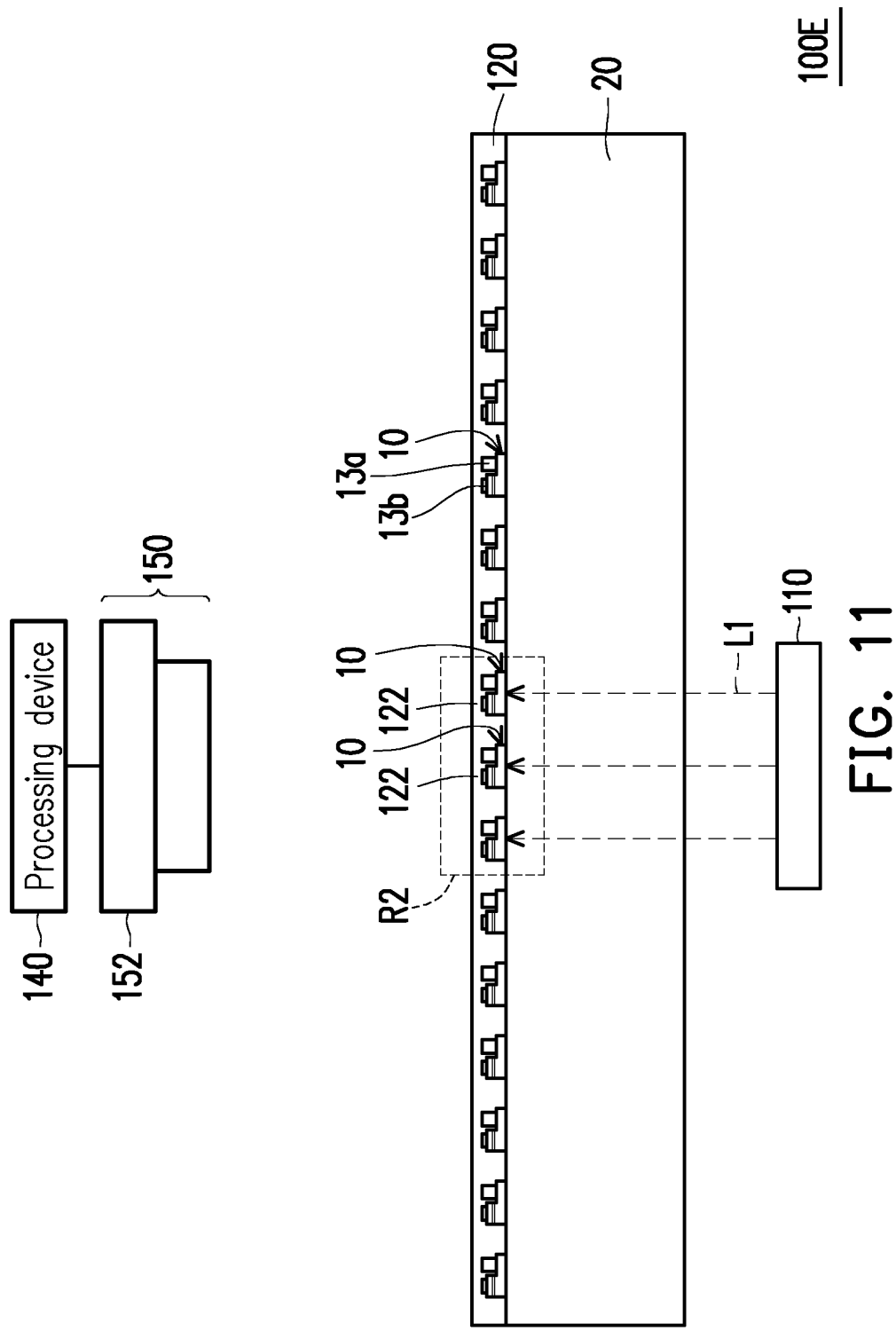
FIG. 11 is a schematic view of an inspection apparatus 100E according to another embodiment of the disclosure.

FIG. 11 is a schematic view of an inspection apparatus 100E according to another embodiment of the disclosure. The inspection apparatus 100E depicted in FIG. 11 is similar to the inspection apparatus 100A depicted in FIG. 3, while the main difference therebetween is in that the two upper surfaces of the electrodes 13a and 13b of each of the LEDs 10 inspected by the inspection apparatus 100E shown in FIG. 11 can be coplanar.

To sum up, in the method for inspecting the LEDs and the inspection apparatus provided in one or more embodiments of the disclosure, the illumination beam is applied to simultaneously irradiate the LEDs, and a sensing probe is applied to measure the charge distribution, the electric field distribution, or the voltage distribution on the LEDs, so as to determine the electro-optical characteristics of the LEDs. As such, a significant amount of LEDs can be rapidly inspected.

Although the disclosure has been disclosed in the above embodiments, it is not intended to limit the disclosure. Those skilled in the art can make some modifications and refinements without departing from the spirit and scope of the disclosure. Hence, the scope of the disclosure is defined by the scope of the appended claims.

What is claimed is:

1. A method for inspecting light-emitting diodes, comprising:
    providing a plurality of light-emitting diodes on a carrier; and
    measuring by a sensing probe a charge distribution, an electrical field distribution, or a voltage distribution on the plurality of light-emitting diodes simultaneously irradiated by an illumination beam, so as to determine a plurality of electro-optical characteristics of the plurality of light-emitting diodes;
    wherein the sensing probe comprises a medium layer, the medium layer is between the carrier and a conductive layer, and a method of measuring by the sensing probe the charge distribution, the electrical field distribution, or the voltage distribution on the plurality of light-emitting diodes simultaneously irradiated by the illumination beam to determine the plurality of electro-optical characteristics of the plurality of light-emitting diodes comprises:
    placing the medium layer of the sensing probe on or over the plurality of light-emitting diodes, the medium layer adjoining the plurality of light-emitting diodes and adapted to be affected by an electric field, a charge, or a voltage to induce a corresponding optical property change, wherein the medium layer has a plurality of inspection regions respectively corresponding to the plurality of light-emitting diodes;
    simultaneously irradiating the plurality of light-emitting diodes by the illumination beam and obtaining an image of the plurality of inspection regions of the medium layer; and
    determining the plurality of electro-optical characteristics of the plurality of light-emitting diodes by the image.

2. The method for inspecting the light-emitting diodes according to claim 1, wherein the step of placing the medium layer of the sensing probe on or over the plurality of light-emitting diodes comprises:
    directly placing the medium layer on the plurality of light-emitting diodes, wherein the medium layer is in contact with the plurality of light-emitting diodes;
    alternatively, placing the medium layer above the plurality of light-emitting diodes, wherein the medium layer is separated from the plurality of light-emitting diodes.

3. The method for inspecting the light-emitting diodes according to claim 1, wherein the medium layer comprises a liquid crystal layer, an electrochromic layer, an electrowetting layer, a suspended particle device layer, voltage-sensing nanoparticles, or a voltage sensitive dye.

4. The method for inspecting the light-emitting diodes according to claim 1, wherein when the illumination beam simultaneously irradiates the plurality of light-emitting diodes, the illumination beam induces the charge distribution, the electric field distribution, or the voltage distribution on the plurality of light-emitting diodes, a charge is accumulated on an electrode of at least one of the plurality of light-emitting diodes, the accumulated charge induces the electric field or the voltage, and the medium layer induces physical or chemical changes by the electric field, the charge, or the voltage, so as to induce a change to the corresponding optical property.

5. The method for inspecting the light-emitting diodes according to claim 1, wherein the plurality of light-emitting diodes comprise a plurality of vertical light-emitting diodes, and the method further comprises:
    placing the conductive layer on the medium layer, wherein the medium layer is disposed between the conductive layer and the plurality of vertical light-emitting diodes.

6. The method for inspecting the light-emitting diodes according to claim 5, wherein the conductive layer is grounded.

7. The method for inspecting the light-emitting diodes according to claim 1, wherein the sensing probe further comprises:
an image capturing light source configured to emit an image capturing beam, wherein the image capturing beam is configured to irradiate the medium layer.

8. The method for inspecting the light-emitting diodes according to claim 7, wherein the sensing probe further comprises:
a polarizing device, wherein the medium layer is disposed between the polarizing device and the plurality of light-emitting diodes, the image capturing beam passes through the polarizing device above the medium layer and is polarized, and the polarized image capturing beam sequentially passes through the medium layer, is reflected, and is then transmitted to the polarizing device.

9. The method for inspecting the light-emitting diodes according to claim 1, wherein the sensing probe further comprises:
a reflective layer disposed below the medium layer and located between the plurality of light-emitting diodes and the medium layer.

10. The method for inspecting the light-emitting diodes according to claim 1, wherein a wavelength of the illumination beam is less than or equal to a light-emitting wavelength of each of the plurality of light-emitting diodes.

11. An inspection apparatus configured to inspect a plurality of light-emitting diodes and comprising:
an illumination light source emitting an illumination beam to simultaneously irradiate the plurality of light-emitting diodes on a carrier;
a sensing probe configured to measure a charge distribution, an electric field distribution, or a voltage distribution on the plurality of light-emitting diodes simultaneously irradiated by the illumination beam; and
a processing device determining a plurality of electro-optical characteristics of the plurality of light-emitting diodes through the charge distribution, the electric field distribution, or the voltage distribution on the plurality of light-emitting diodes simultaneously irradiated by the illumination beam; wherein the sensing probe further comprises:
a medium layer adjoining the plurality of light-emitting diodes and adapted to be affected by an electric field, a charge, or a voltage to induce a corresponding optical property change, wherein the medium layer has a plurality of inspection regions respectively corresponding to the plurality of light-emitting diodes, and the medium layer is between the carrier and a conductive layer; and
an optical-electro sensor obtaining an image of the plurality of inspection regions of the medium layer, wherein the processing device and the optical-electro sensor are electrically connected, and the processing device determines the plurality of electro-optical characteristics of the plurality of light-emitting diodes according to the image of the plurality of inspection regions of the medium layer.

12. The inspection apparatus according to claim 11, wherein:
the medium layer is directly disposed on the plurality of light-emitting diodes and is in contact with the plurality of light-emitting diodes;
alternatively, the medium layer is placed above the plurality of light-emitting diodes and is separated from the plurality of light-emitting diodes.

13. The inspection apparatus according to claim 11, wherein the medium layer comprises a liquid crystal layer, an electrochromic layer, an electro-wetting layer, a suspended particle device layer, voltage-sensing nanoparticles, or a voltage sensitive dye.

14. The inspection apparatus according to claim 11, wherein when the illumination beam simultaneously irradiates the plurality of light-emitting diodes, the illumination beam induces the charge distribution, the electric field distribution, or the voltage distribution on the plurality of light-emitting diodes, a charge is accumulated on an electrode of at least one of the plurality of light-emitting diodes, the accumulated charge induces the electric field or the voltage, and the medium layer induces physical or chemical changes by the electric field, the charge, or the voltage, so as to induce a change to the corresponding optical property.

15. The inspection apparatus according to claim 11, wherein the plurality of light-emitting diodes comprise a plurality of vertical light-emitting diodes, and the inspection apparatus further comprises:
the conductive layer, wherein the medium layer is disposed between the conductive layer and the plurality of vertical light-emitting diodes.

16. The inspection apparatus according to claim 15, wherein the conductive layer is grounded.

17. The inspection apparatus according to claim 11, wherein the sensing probe further comprises:
an image capturing light source configured to emit an image capturing beam, wherein the image capturing beam is configured to irradiate the medium layer.

18. The inspection apparatus according to claim 17, wherein the sensing probe further comprises:
a polarizing device, wherein the medium layer is disposed between the polarizing device and the plurality of light-emitting diodes, the image capturing beam passes through the polarizing device above the medium layer and is polarized, and the polarized image capturing beam sequentially passes through the medium layer, is reflected, and is then transmitted to the polarizing device.

19. The inspection apparatus according to claim 11, wherein the sensing probe further comprises:
a reflective layer disposed below the medium layer and located between the plurality of light-emitting diodes and the medium layer.

20. The inspection apparatus according to claim 11, wherein a wavelength of the illumination beam is less than or equal to a light-emitting wavelength of each of the plurality of light-emitting diodes.

* * * * *